(12) United States Patent
Takeuchi

(10) Patent No.: US 7,684,206 B2
(45) Date of Patent: Mar. 23, 2010

(54) ELECTRONIC CIRCUIT MODULE INCLUDING CHIP MOUNTED TO MULTI-LAYER WIRING PLATE IN FLIP CHIP MANNER

(75) Inventor: Masayoshi Takeuchi, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 333 days.

(21) Appl. No.: 11/952,077

(22) Filed: Dec. 6, 2007

(65) Prior Publication Data

US 2008/0291642 A1     Nov. 27, 2008

(30) Foreign Application Priority Data

Jan. 15, 2007   (JP)   ............... 2007-005598

(51) Int. Cl.
*H05K 1/14* (2006.01)
(52) U.S. Cl. .................... 361/794; 361/728
(58) Field of Classification Search ............ 361/794, 361/728, 760–763; 174/259–262, 534; 257/296, 257/297, 686
See application file for complete search history.

(56) References Cited

U.S. PATENT DOCUMENTS

| 7,009,114 B2 | 3/2006 | Urakawa et al. | |
|---|---|---|---|
| 2008/0251940 A1* | 10/2008 | Lee et al. | 257/777 |
| 2009/0079006 A1* | 3/2009 | Tanaka et al. | 257/368 |

* cited by examiner

*Primary Examiner*—Jinhee J Lee
*Assistant Examiner*—Yuriy Semenenko
(74) *Attorney, Agent, or Firm*—Beyer Law Group LLP

(57) ABSTRACT

The invention provides an electronic circuit module capable of reliably mounting a chip to a multi-layer wiring plate in a flip chip manner.

In an electronic circuit module according to an embodiment of the invention, a chip including bumps with a height of d is mounted to a multi-layer wiring plate including surface electrodes and internal electrodes in a flip chip manner. In the multi-layer wiring plate, when the minimum thickness of the surface electrode and the internal electrodes overlapping each other below each of the bumps is TD and the maximum thickness of the surface electrode and the internal electrodes overlapping each other in a space surrounded by the bumps is TI, the surface electrodes and the internal electrodes are arranged so as to satisfy TI<TD+d.

12 Claims, 4 Drawing Sheets

US 7,684,206 B2

ELECTRONIC CIRCUIT MODULE INCLUDING CHIP MOUNTED TO MULTI-LAYER WIRING PLATE IN FLIP CHIP MANNER

CLAIM OF PRIORITY

This application claims benefit of the Japanese Patent Application No. 2007-005598 filed on Jan. 15, 2007, which is hereby incorporated by reference.

BACKGROUND OF THE INVENTION

1. Field of the Invention

The present invention relates to an electronic circuit module, and more particularly, to an electronic circuit module that can be appropriately used for a module having a chip with bumps mounted to a multi-layer wiring plate in a flip chip manner.

2. Description of the Related Art

FIG. 5 is a diagram illustrating an electronic circuit module 101 according to the related art. As shown in FIG. 5, the electronic circuit module 101 according to the related art is formed by mounting a semiconductor chip 102 to the front surface of a multi-layer wiring plate 104 in a flip chip manner. The multi-layer wiring plate 104 is formed in a laminated structure of wiring plates 105 obtained by providing surface electrodes 107, internal electrodes 108 and external connection electrodes 109 on the front and rear surfaces of a plurality of ceramic substrates (LTCC and HTCC) 106.

However, as shown in FIG. 5, when the internal electrodes 108 are concentrated inside the multi-layer wiring plate 104 below the chip 102 in order to improve the degree of the integration of the multi-layer wiring plate 104, the front surface of the multi-layer wiring plate 104 partially protrudes to come into contact with the chip 102 due to an increase in the thickness of the electrodes 108 overlapping each other, which makes it difficult to connect bumps 103 of the chip 102 to surface electrodes 107 of the multi-layer wiring plate 104.

Further, as shown in FIGS. 6 and 7, when the surface electrode 107 have a non-uniform thickness due to the arrangement of the internal electrodes 108, the chip 102 is mounted to the multi-layer wiring plate 104 in a flip chip manner while some of the bumps 103, that is, bumps 103A do not come into contact with the surface electrodes 107, which causes bad connection between the chip 102 and the multi-layer wiring plate 104, resulting in low connection reliability of the chip 102.

SUMMARY

According to a first aspect of the invention, an electronic circuit module includes: a multi-layer wiring plate that is formed of a laminate of a plurality of wiring plates, and includes a plurality of surface electrodes provided on an outer layer of the laminate and a plurality of internal electrodes provided on the internal wiring plates; and a chip that includes bumps with a height of d, and is connected to the multi-layer wiring plate in a flip chip manner by bringing the bumps into contact with the surface electrodes. In the multi-layer wiring plate, when the minimum thickness of the surface electrode and the internal electrodes overlapping each other below each of the bumps is TD and the maximum thickness of the surface electrode and the internal electrodes overlapping each other in a space surrounded by the bumps is TI, the surface electrodes and the internal electrodes are arranged so as to satisfy TI<TD+d.

According to the electronic circuit module of the first aspect, a value obtained by adding the height of the bump to the thickness of the surface electrode and the internal electrodes overlapping each other below the bump is larger than the thickness of the surface electrode and the internal electrodes overlapping each other in the space surrounded by the bumps. Therefore, it is possible to prevent a protruding portion of the multi-layer wiring plate from coming into contact with the chip even when the multi-layer wiring plate protrudes.

According to a second aspect of the invention, an electronic circuit module includes: a multi-layer wiring plate that is formed of a laminate of a plurality of wiring plates, and includes a plurality of surface electrodes provided on an outer layer of the laminate and a plurality of internal electrodes provided on the internal wiring plates; and a chip that includes bumps with a height of d, and is connected to the multi-layer wiring plate in a flip chip manner by bringing the bumps into contact with the surface electrodes. In the multi-layer wiring plate, when the thickness of the surface electrodes and the internal electrodes is t, the minimum number of overlaps between the surface electrode and the internal electrodes below each of the bumps is 'a', and the maximum number of overlaps between the surface electrode and the internal electrodes in a space surrounded by the bumps is 'b', the surface electrodes and the internal electrodes are arranged so as to satisfy bt<at+d.

According to the electronic circuit module of the second aspect, a value obtained by adding the thickness of the bump to the thickness of the surface electrode and the internal electrodes overlapping each other below each of the bumps is larger than the thickness of the surface electrode and the internal electrodes overlapping each other in the space surrounded by the bumps. Therefore, it is possible to prevent a protruding portion of the multi-layer wiring plate from coming into contact with the chip even when the multi-layer wiring plate protrudes. In addition, when the surface electrode and the internal electrode have the same thickness, it is possible to easily control the amount of protrusion of the multi-layer wiring plate by adjusting the number of overlaps between the surface electrode and the internal electrodes.

According to a third aspect of the invention, an electronic circuit module includes: a multi-layer wiring plate that is formed of a laminate of a plurality of wiring plates, and includes a plurality of surface electrodes provided on an outer layer of the laminate and a plurality of internal electrodes provided on the internal wiring plates; and a chip that includes bumps with a height of d, and is connected to the multi-layer wiring plate in a flip chip manner by bringing the bumps into contact with the surface electrodes. In the multi-layer wiring plate, when the thickness of the surface electrode or the internal electrode on an n-th layer from an outer layer of the multi-layer wiring plate below the bumps is $t_n$, the minimum number of overlaps between the surface electrode and the internal electrodes below each of the bumps is 'a', the thickness of the surface electrode or the internal electrode on the n-th layer from the outer layer of the multi-layer wiring plate in a space surrounded by the bumps is $T_n$, and the maximum number of overlaps between the surface electrode and the internal electrodes in the space surrounded by the bumps is 'b', the surface electrodes and the internal electrodes are arranged so as to satisfy Expression given below:

$$\sum_{n=1}^{b} T_n < \sum_{n=1}^{a} t_n + d.$$

According to the electronic circuit module of the third aspect, a value obtained by adding the thickness of the bump to the thickness of the surface electrode and the internal electrodes overlapping each other below the bumps is larger than the thickness of the surface electrode and the internal electrodes overlapping each other in the space surrounded by the bumps. Therefore, it is possible to prevent a protruding portion of the multi-layer wiring plate from coming into contact with the chip even when the multi-layer wiring plate protrudes. In addition, when the surface electrode and the internal electrodes are formed with different thicknesses on each of the wiring plates, it is possible to easily control the amount of protrusion of the multi-layer wiring plate by the above-mentioned Expression.

According to a fourth aspect of the invention, in the electronic circuit module according to any one of the first to third aspects, preferably, the multi-layer wiring plate is formed such that the numbers of overlaps between the surface electrodes and the internal electrodes below the plurality of the bumps are equal to each other.

According to the electronic circuit module of the fourth aspect, since the surface electrodes connected to the bumps have the same height, it is possible to mount a chip to a multi-layer wiring plate while all of the bumps are connected to the surface electrodes.

According to a fifth aspect of the invention, in the electronic circuit module according to any one of the first to fourth aspects, preferably, in the multi-layer wiring plate, instead of the internal electrodes, dummy electrodes are provided on each of the internal wiring plates below the plurality of bumps.

According to the electronic circuit module of the fifth aspect, the number of electrodes below the bumps increases to make the surface electrode closer to the bump. Therefore, it is possible to reliably mount a chip to a multi-layer wiring plate in a flip chip manner without changing the arrangement of the internal electrodes inside the multi-layer wiring plate below the chip.

According to a sixth aspect of the invention, in the electronic circuit module according to any one of the first to fourth aspects, preferably, in the multi-layer wiring plate, instead of the internal electrodes, ground electrodes are provided on each of the internal wiring plates below the plurality of bumps.

According to the electronic circuit module of the sixth aspect, the number of electrodes below the bumps increases to make the surface electrodes closer to the bumps. Therefore, it is possible to reliably mount a chip to a multi-layer wiring plate in a flip chip manner without changing the arrangement of the internal electrodes inside the multi-layer wiring plate below the chip. In addition, the arrangement of the ground electrodes, not the internal electrodes or the dummy electrodes, below the bumps makes it possible to effectively use the space for forming the multi-layer wiring plate.

According to the electronic circuit modules of the above-mentioned aspects, the multi-layer wiring plate is formed such that the thickness of the surface electrodes and the internal electrodes overlapping each other is controlled. Therefore, it is possible to prevent a portion of the multi-layer wiring plate from coming into contact with the chip. In addition, since the surface electrodes connected to the bumps have the same height, it is possible to reliably mount a chip to a multi-layer wiring plate.

DESCRIPTION OF THE EMBODIMENTS

Figure 1:
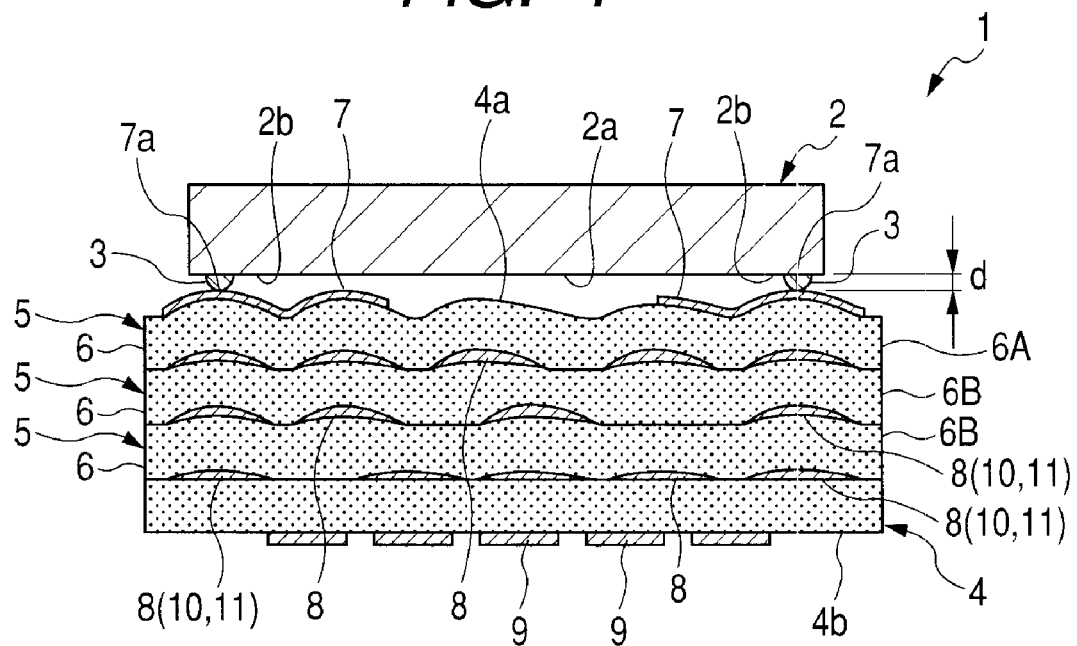
FIG. 1 is a longitudinal cross-sectional view illustrating an electronic circuit module according to an embodiment of the invention.
Figure 2:
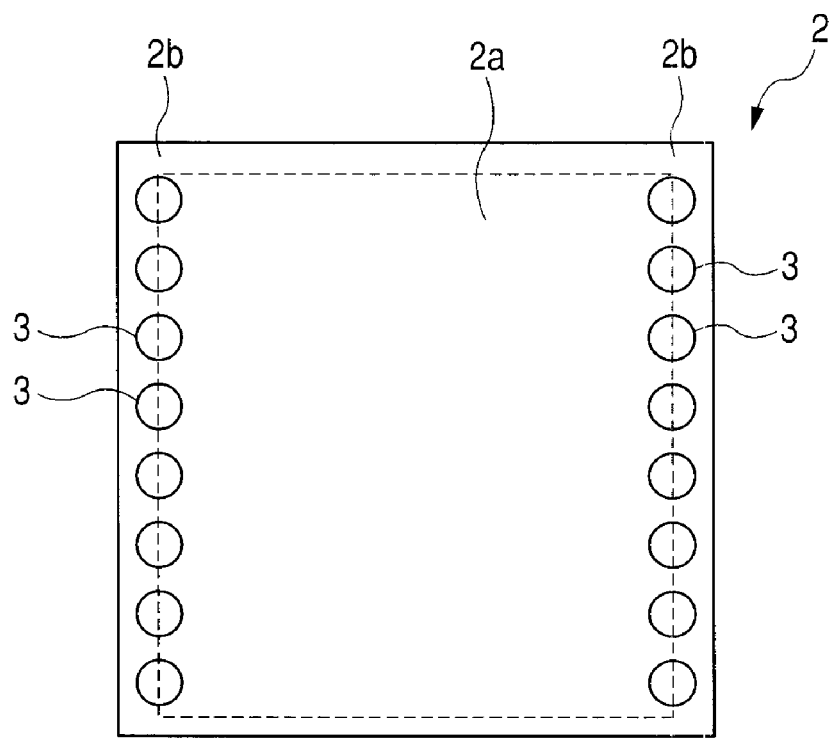
FIG. 2 is a bottom view illustrating a chip according to the embodiment.
Figure 3:
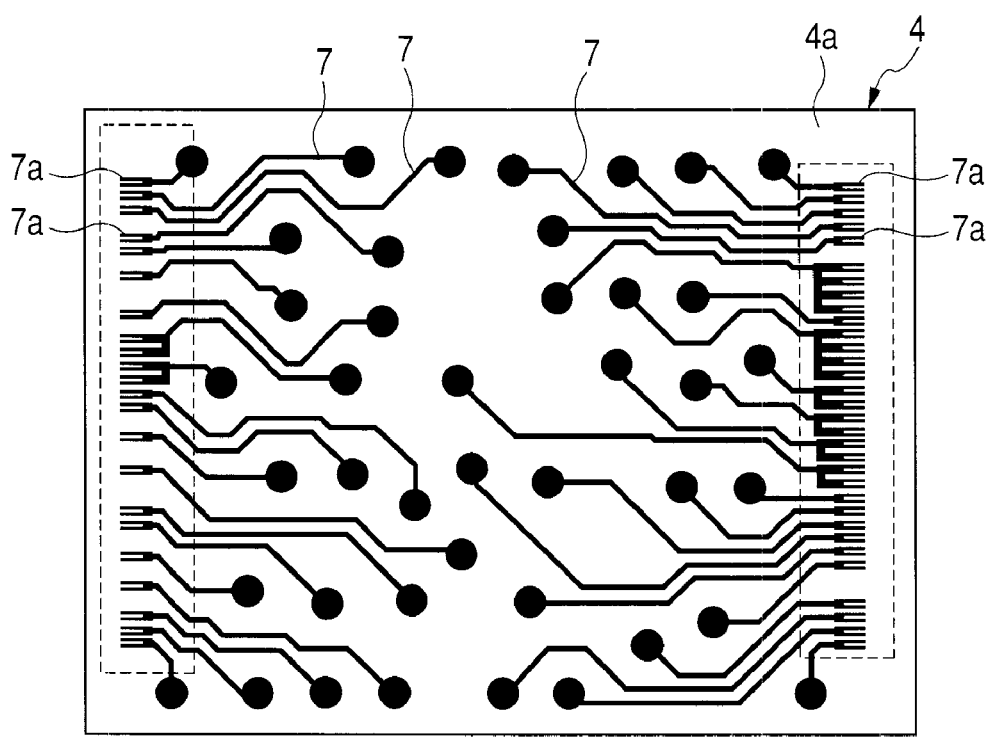
FIG. 3 is a plan view illustrating an outer layer of a multi-layer wiring plate according to the embodiment.
Figure 4:
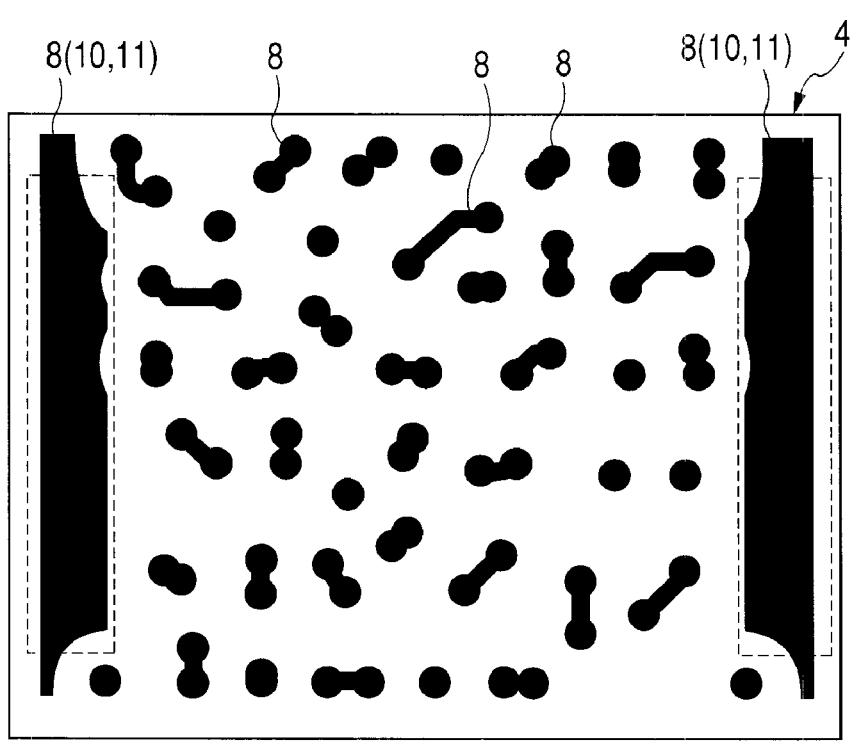
FIG. 4 is a plan view illustrating an internal layer of the multi-layer wiring plate according to the embodiment.

Hereinafter, an electronic circuit module according to an embodiment of the invention will be described with reference to FIGS. 1 to 4. FIG. 1 is a longitudinal cross-sectional view illustrating the electronic circuit module according to this embodiment, and FIG. 2 is a bottom view illustrating a chip according to this embodiment. FIG. 3 is a plan view illustrating an outer layer of a multi-layer wiring plate according to this embodiment, and FIG. 4 is a plan view illustrating an internal layer of the multi-layer wiring plate according to this embodiment. An area represented by a dotted line in FIG. 2 indicates a space surrounded by bumps, and areas represented by dotted lines in FIGS. 3 and 4 indicate spaces in which the bumps are arranged.

As shown in FIG. 1, an electronic circuit module 1 according to this embodiment is formed by mounting a chip 2 on a front surface 4a of a multi-layer wiring plate 4 in a flip chip manner.

A semiconductor chip is used as the chip 2, and the chip 2 includes bumps 3 having a height of d, as shown in FIG. 1. The bumps 3 may be arranged in a linear pattern, a frame pattern, or a lattice pattern. In this embodiment, as shown in FIG. 2, the bumps 3 are arranged in two rows along two sides 2b of a rear surface 2a of the chip 2.

As shown in FIG. 1, the multi-layer wiring plate 4 has a laminated structure of wiring plates 5 obtained by providing electrodes 7, 8, and 9 on the front and rear surfaces of a plurality of ceramic substrates (LTCC and HTCC) 6. Each of the ceramic substrates 6 has a constant thickness. When the thickness of the ceramic substrates 6 is uniform, the ceramic substrates 6 may have different thicknesses.

The surface electrodes 7 to be connected to the bumps 3 of the chip 2 are formed on the front surface 4a of the multi-layer wiring plate 4, and the external connection electrodes 9 to be connected to an external electronic circuit module (not shown) are provided on the rear surface 4b. In addition, the internal electrodes 8 for connecting the surface electrodes 7 and the external connection electrodes 9 are provided in internal layers 6B.

In the multi-layer wiring plate 4, as shown in FIGS. 1 to 4, the number of overlaps between the surface electrode 7 and the internal electrodes 8 in the direction in which they are laminated depends on the arrangement of the surface electrode 7 and the internal electrodes 8. As shown in FIG. 1, in a thickness direction of the multi-layer wiring plate 4, there is no overlap between the surface electrode 7 and the internal electrodes 8 in the direction in which they are laminated, but, in another thickness direction, all of the surface electrode 7 and the internal electrodes 8 overlap each other in the direction in which they are laminated. When the number of overlaps between the surface electrode 7 and the internal electrodes 8 is locally different, the amount of protrusion of the multi-layer wiring plate 4 is also locally different.

In this embodiment, as shown in FIGS. 1 and 2, the multi-layer wiring plate 4 is formed such that the amount of partial protrusion of the multi-layer wiring plate 4 is controlled in consideration of the thicknesses of the surface electrodes 7 and the internal electrodes 8 overlapping each other below the plurality of bumps 3 and in a space surrounded by two rows of bumps 3. Specifically, when the minimum thickness of the surface electrode 7 and the internal electrodes 8 overlapping each other below the plurality of bumps 3 is TD and the maximum thickness of the surface electrode 7 and the internal electrodes 8 overlapping each other in the space surrounded by two rows of bumps 3 is TI, the surface electrodes 7 and the internal electrodes 8 are arranged so as to satisfy TI<TD+d.

Next, a detailed calculating method will be described. In this embodiment, the surface electrodes 7 and the internal electrode 8 have a thickness of t. Therefore, when the minimum number of overlaps between the surface electrode 7 and the internal electrodes 8 below the plurality of bumps 3 is 'a', the minimum thickness TD of the surface electrode 7 and the internal electrodes 8 overlapping each other is 'at' (TD=at). When the maximum number of overlaps between the surface electrode 7 and the internal electrodes 8 in the space surrounded by the plurality of bumps 3 is 'b', the maximum thickness TI of the surface electrode 7 and the internal electrodes 8 overlapping each other is 'bt' (TI=bt). That is, when the surface electrodes 7 and the internal electrodes 8 have the same thickness, the surface electrodes 7 and the internal electrodes 8 are arranged so as to satisfy bt (=TI)<at+d (=TD+d).

In this embodiment, as shown in FIG. 1, the surface electrodes 7 and the internal electrodes 8 are formed on the front surfaces of all of the outer layer 6A and the internal layers 6B below the plurality of bumps 3 such that the numbers of surface electrodes 7 and internal electrodes 8 overlapping each other below the bumps 2 are equal to each other. When it is difficult to arrange the internal electrodes 8 below the bumps 3, instead of the internal electrodes 8, dummy electrodes 10 or ground electrodes 11 may be provided. In this case, as shown in FIGS. 3 and 4, the dummy electrodes 10 or the ground electrodes 11 may be formed of plates (solid electrodes) covering two rows of bumps 3.

Next, the operation of the electronic circuit module 1 according to this embodiment will be described with reference to FIGS. 1 to 4.

Figure 5:
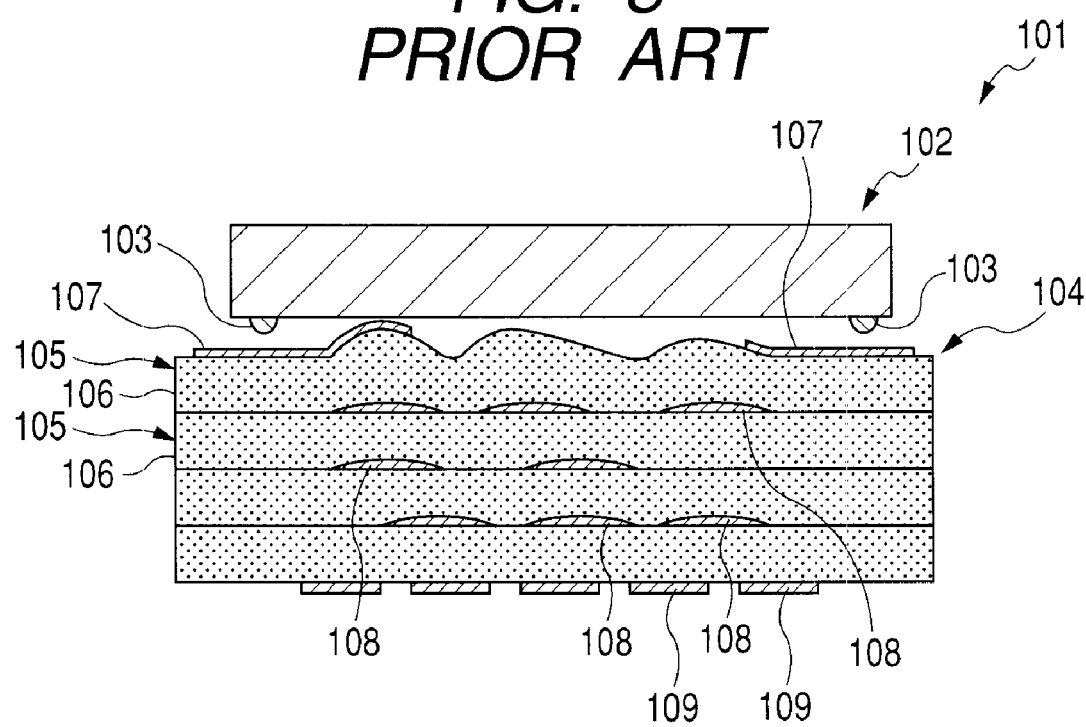
FIG. 5 is a longitudinal cross-sectional view illustrating contact between a chip and a protruding portion of a multi-layer wiring plate of an electronic circuit module according to the related art.
Figure 6:
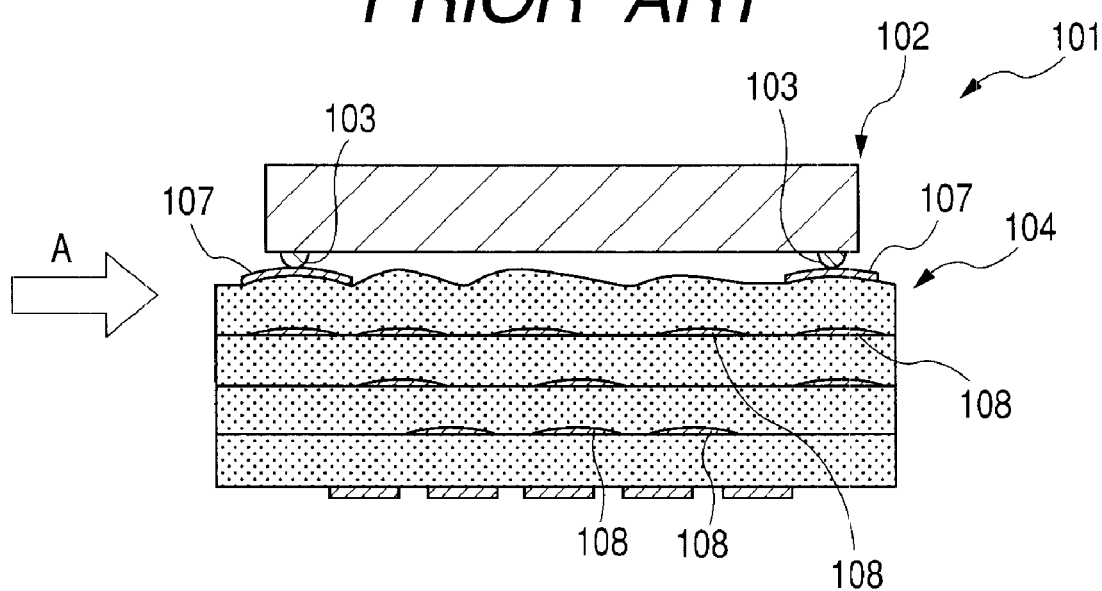
FIG. 6 is a longitudinal cross-sectional view illustrating some of the surface electrodes not contacted with bumps in the electronic circuit module according to the related art.

In the electronic circuit module 1 according to this embodiment, as shown in FIG. 1, the multi-layer wiring plate 4 is formed such that a value obtained by adding the height d of the bump 3 to the minimum thickness TD of the surface electrode 7 and the internal electrodes 8 overlapping each other below the bump 3 is larger than the maximum thickness TI of the surface electrode 7 and the internal electrodes 8 overlapping each other in the space surrounded by the bumps 3. That is, the multi-layer wiring plate 4 is formed so as to satisfy TI<TD+d. When TI≧TD+d, as in the conventional electronic circuit module (see FIG. 5) 101, the multi-layer wiring plate 4 partially protrudes to come into contact with the chip 2. However, when TI<TD+d is satisfied, as shown in FIG. 1, it is possible to mount the chip 2 to the multi-layer wiring plate 4 in a flip chip manner without contact between a protruding portion of the multi-layer wiring plate 4 and the chip 2.

Specifically, in this embodiment, the surface electrodes 7 and the internal electrodes 8 are formed with the same thickness of t, and the surface electrodes 7 and the internal electrodes 8 are arranged in consideration of the number of overlaps therebetween, thereby controlling the amount of partial protrusion of the multi-layer wiring plate 4. That is, when the minimum number of overlaps between the surface electrode 7 and the internal electrodes 8 below each of the bumps 3 is 'a' and the maximum number of overlaps between the surface electrode 7 and the internal electrodes 8 in the space surrounded by the plurality of bumps 3 is 'b', the surface electrodes 7 and the internal electrodes 8 are arranged so as to satisfy bt<at +d.

That is, in order to prevent bad connection of the chip 2, the number of overlaps between the internal electrodes 8 below the bump 3 increases to make the surface electrode 7 closer to the bump 3, which makes is possible to reliably contact the bumps 3 with the surface electrodes 7. However, it may be difficult to arrange the internal electrodes 8 on each layer below the bumps 3 due to the layout of the multi-layer wiring plate 4. In this case, as shown in FIGS. 1 and 3, instead of the internal electrodes 8, the dummy electrodes 10 or the ground electrodes 11 may be provided. The arrangement of the dummy electrodes 10 or the ground electrodes 11 below the bumps 3 makes the surface electrodes 7 closer to the bumps 3 without changing the arrangement of the internal electrodes 8. Therefore, it is possible to reliably contact the bumps 3 with the surface electrodes 7. In particular, the arrangement of the ground electrodes 11 below the bumps 3 makes it possible to effectively use the space for arranging the multi-layer wiring plate 4.

Figure 7:
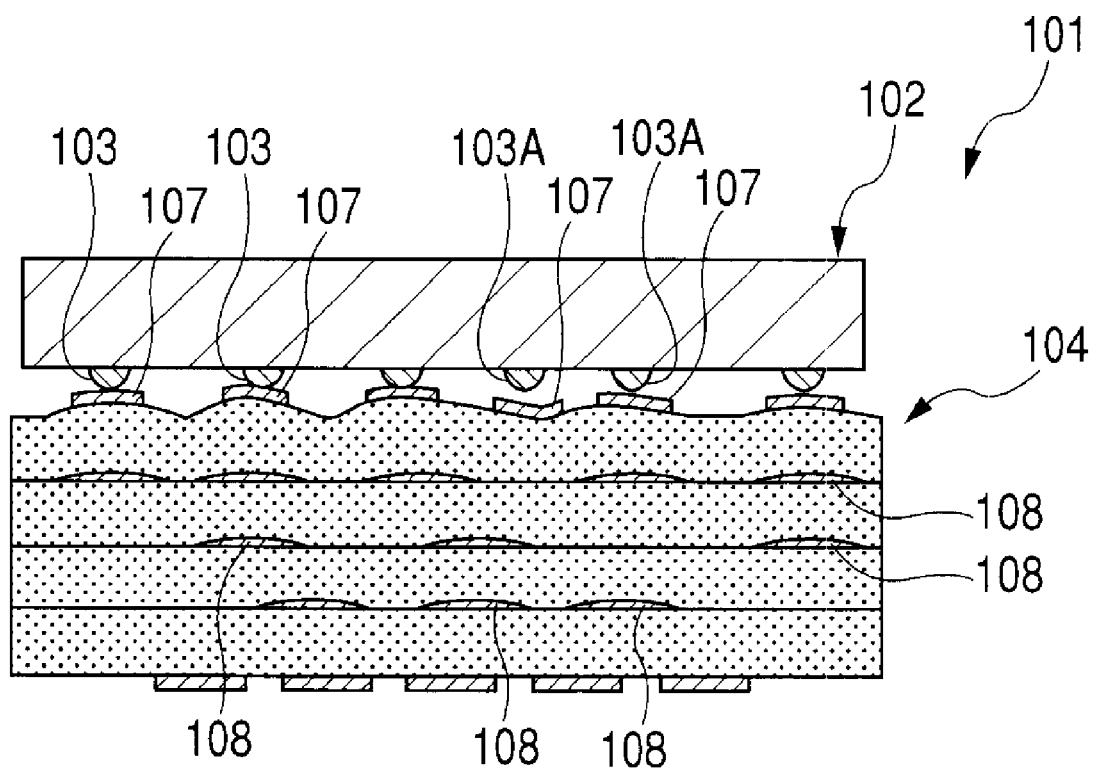
FIG. 7 is a longitudinal cross-sectional view of the electronic circuit module according to the related art, as viewed in the direction of arrow A.

When the height of the surface electrode 7 is partially different without a protruding portion of the multi-layer wiring plate 4 coming into contact with the chip 2, some of the plurality of bumps 3 do not contact with the surface electrodes 7, and the chip 2 does not contact the multi-layer wiring plate 4 (see FIG. 7). Therefore, in this embodiment, the numbers of overlaps between the surface electrodes 7 and the internal electrodes 8 below the plurality of bumps 3 are equal to each other. When the numbers of overlaps between the surface electrodes 7 and the internal electrodes 8 below all of the bumps 3 are equal to each other, connection pads 7a of the surface electrodes 7 connected to the bumps 3 have the same height, which makes it possible to mount the chip 2 to the multi-layer wiring plate 4 while all of the bumps 3 are connected to the surface electrodes 7. As shown in FIGS. 3 and 4, when the plane dummy electrodes 10 or ground electrodes 11 are provided so as to cover two rows of bumps 3, it is possible to more improve formability and easily adjust the height of multi-layer wiring plate 4, as compared to the structure in which the internal electrodes 8, the dummy electrodes 10 or the ground electrodes 11 are provided below each bump 3.

That is, according to the electronic circuit module 1 of this embodiment, the multi-layer wiring plate 4 is formed such that the thickness of the surface electrodes 7 and the internal electrodes 8 overlapping each other is controlled. Therefore, a protruding portion of the multi-layer wiring plate 4 does not come into contact with the chip 2, and the surface electrodes 7 connected to the bumps 3 have the same height, which makes it possible to reliably mount the chip 2 to the multi-layer wiring plate 4 in a flip chip manner.

The invention is not limited to the above-described embodiment, and various modifications and changes of the invention can be made without departing from the scope of the invention.

For example, in the multi-layer wiring plate 4, the surface electrodes 7 and the internal electrodes 8 may be formed with different thicknesses on each layer. In this case, when the thickness of the surface electrode 7 or the internal electrode 8 on an n-th layer from the outer layer 6A of the multi-layer wiring plate 4 below the bump 3 is $t_n$, the minimum number of overlaps between the surface electrode 7 and the internal electrodes 8 below each of the bumps 3 is 'a', the thickness of the surface electrode 7 or the internal electrode 8 on the n-th layer from the outer layer 6A of the multi-layer wiring plate 4 in the space surrounded by the bumps 3 is $T_n$, and the maximum number of overlaps between the surface electrode 7 and the internal electrodes 8 in the space surrounded by the bumps 3 is 'b', the surface electrodes 7 and the internal electrodes 8 are arranged so as to satisfy Expression 1 given below:

$$\sum_{n=1}^{b} T_n < \sum_{n=1}^{a} t_n + d. \qquad \text{[Expression 1]}$$

In Expression 1, the left side is the maximum thickness T1 of the surface electrode 7 and the internal electrodes 8 overlapping each other in the space surrounded by the bumps 3, and the right side is a value TD+d obtained by adding the height d of the bump 3 to the minimum thickness TD of the surface electrode 7 and the internal electrodes 8 overlapping each other below the bump 3. In this case, similar to the above-described embodiment, it is possible to prevent a protruding portion of the multi-layer wiring plate 4 from coming into contact with the chip 2 even when the multi-layer wiring plate 4 protrudes.

The invention claimed is:

1. An electronic circuit module comprising:
   a multi-layer wiring plate that is formed of a laminate of a plurality of wiring plates, and includes a plurality of surface electrodes provided on an outer layer of the laminate and a plurality of internal electrodes provided on the internal wiring plates; and
   a chip that includes bumps with a height of d, and is connected to the multi-layer wiring plate in a flip chip manner by bringing the bumps into contact with the surface electrodes,
   wherein, in the multi-layer wiring plate, when the minimum thickness of the surface electrode and the internal electrodes overlapping each other below the bump is TD and the maximum thickness of the surface electrode and the internal electrodes overlapping each other in a space surrounded by the bumps is TI, the surface electrodes and the internal electrodes are arranged so as to satisfy TI<TD+d.

2. The electronic circuit module according to claim 1, wherein the multi-layer wiring plate is formed such that the numbers of overlaps between the surface electrodes and the internal electrodes below the plurality of the bumps are equal to each other.

3. The electronic circuit module according to claim 1, wherein, in the multi-layer wiring plate, instead of the internal electrodes, dummy electrodes are provided on each of the internal wiring plates below the plurality of bumps.

4. The electronic circuit module according to claim 1, wherein, in the multi-layer wiring plate, instead of the internal electrodes, ground electrodes are provided on each of the internal wiring plates below the plurality of bumps.

5. An electronic circuit module comprising:
   a multi-layer wiring plate that is formed of a laminate of a plurality of wiring plates, and includes a plurality of surface electrodes provided on an outer layer of the laminate and a plurality of internal electrodes provided on the internal wiring plates; and
   a chip that includes bumps with a height of d, and is connected to the multi-layer wiring plate in a flip chip manner by bringing the bumps into contact with the surface electrodes,
   wherein, in the multi-layer wiring plate, when the thickness of the surface electrodes and the internal electrodes is t, the minimum number of overlaps between the surface electrode and the internal electrodes below each of the bumps is 'a', and the maximum number of overlaps between the surface electrode and the internal electrodes in a space surrounded by the bumps is 'b', the surface electrodes and the internal electrodes are arranged so as to satisfy bt<at+d.

6. The electronic circuit module according to claim 5, wherein the multi-layer wiring plate is formed such that the numbers of overlaps between the surface electrodes and the internal electrodes below the plurality of the bumps are equal to each other.

7. The electronic circuit module according to claim 5, wherein, in the multi-layer wiring plate, instead of the internal electrodes, dummy electrodes are provided on each of the internal wiring plates below the plurality of bumps.

8. The electronic circuit module according to claim 5, wherein, in the multi-layer wiring plate, instead of the internal electrodes, ground electrodes are provided on each of the internal wiring plates below the plurality of bumps.

9. An electronic circuit module comprising:
   a multi-layer wiring plate that is formed of a laminate of a plurality of wiring plates, and includes a plurality of surface electrodes provided on an outer layer of the laminate and a plurality of internal electrodes provided on the internal wiring plates; and
   a chip that includes bumps with a height of d, and is connected to the multi-layer wiring plate in a flip chip manner by bringing the bumps into contact with the surface electrodes,
   wherein, in the multi-layer wiring plate, when the thickness of the surface electrode or the internal electrode on an n-th layer from an outer layer of the multi-layer wiring plate below the bump is $t_n$, the minimum number of overlaps between the surface electrode and the internal electrodes below each of the bumps is 'a', the thickness of the surface electrode or the internal electrode on the n-th layer from the outer layer of the multi-layer wiring plate in a space surrounded by the bumps is $T_n$, and the maximum number of overlaps between the surface electrode and the internal electrodes in the space surrounded by the bumps is 'b', the surface electrodes and the internal electrodes are arranged so as to satisfy Expression given below:

$$\sum_{n=1}^{b} T_n < \sum_{n=1}^{a} t_n + d.$$

10. The electronic circuit module according to claim 9, wherein the multi-layer wiring plate is formed such that the numbers of overlaps between the surface electrodes and the internal electrodes below the plurality of the bumps are equal to each other.

11. The electronic circuit module according to claim 9, wherein, in the multi-layer wiring plate, instead of the internal electrodes, dummy electrodes are provided on each of the internal wiring plates below the plurality of bumps.

12. The electronic circuit module according to claim 9, wherein, in the multi-layer wiring plate, instead of the internal electrodes, ground electrodes are provided on each of the internal wiring plates below the plurality of bumps.

\* \* \* \* \*